United States Patent
Park et al.

(10) Patent No.: US 9,880,461 B2
(45) Date of Patent: Jan. 30, 2018

(54) METHOD FOR MANUFACTURING MASTER MOLD, MASTER MOLD MANUFACTURED THEREBY, METHOD FOR MANUFACTURING TRANSPARENT PHOTOMASK, TRANSPARENT PHOTOMASK MANUFACTURED THEREBY, AND METHOD FOR FORMING CONDUCTIVE MESH PATTERN USING TRANSPARENT PHOTOMASK

(71) Applicant: LG CHEM, LTD., Seoul (KR)

(72) Inventors: Jeongho Park, Daejeon (KR); Jinmi Jung, Daejeon (KR); Yujin Jeong, Daejeon (KR); Bu Gon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 35 days.

(21) Appl. No.: 15/112,586

(22) PCT Filed: Feb. 13, 2015

(86) PCT No.: PCT/KR2015/001489
§ 371 (c)(1),
(2) Date: Jul. 19, 2016

(87) PCT Pub. No.: WO2015/122721
PCT Pub. Date: Aug. 20, 2015

(65) Prior Publication Data
US 2016/0342081 A1    Nov. 24, 2016

(30) Foreign Application Priority Data

Feb. 13, 2014  (KR) .................. 10-2014-0016625

(51) Int. Cl.
| | | |
|---|---|---|
| G03F 1/50 | (2012.01) | |
| G03F 1/68 | (2012.01) | |
| G03F 1/80 | (2012.01) | |
| G03F 7/00 | (2006.01) | |
| C23C 14/18 | (2006.01) | |
| C23C 14/22 | (2006.01) | |
| C23C 14/34 | (2006.01) | |
| C23C 18/02 | (2006.01) | |

(52) U.S. Cl.
CPC .............. *G03F 1/50* (2013.01); *C23C 14/185* (2013.01); *C23C 14/221* (2013.01); *C23C 14/34* (2013.01); *G03F 1/68* (2013.01); *G03F 1/80* (2013.01); *G03F 7/0002* (2013.01); *C23C 18/02* (2013.01); *G06F 2203/04102* (2013.01); *G06F 2203/04103* (2013.01); *G06F 2203/04112* (2013.01)

(58) Field of Classification Search
CPC ..... G03F 1/50; G03F 1/68; G03F 1/80; G03F 7/0002; C23C 14/185; C23C 14/221; C23C 14/34
USPC .................. 430/5, 312, 313, 318, 319, 320
See application file for complete search history.

(56) References Cited

U.S. PATENT DOCUMENTS

| | | |
|---|---|---|
| 6,160,611 A | 12/2000 | Miyake |
| 2010/0156840 A1 | 6/2010 | Frey et al. |
| 2011/0236833 A1 | 9/2011 | Chan |
| 2015/0064628 A1 | 3/2015 | Guo |

FOREIGN PATENT DOCUMENTS

| | | |
|---|---|---|
| JP | 11-237744 A | 8/1999 |
| JP | 2012-079435 A | 4/2012 |
| KR | 10-2013-0044058 A | 5/2013 |
| TW | 201351062 A | 12/2013 |
| WO | 2013/158543 A1 | 10/2013 |

*Primary Examiner* — Christopher G Young
(74) *Attorney, Agent, or Firm* — Dentons US LLP

(57) ABSTRACT

The present invention relates to a method for manufacturing a master mold, a master mold manufactured by the method, a method for manufacturing a transparent photomask, a transparent photomask manufactured by the method, and a method for manufacturing a conductive mesh pattern by using the transparent photomask.

20 Claims, 14 Drawing Sheets

60

METHOD FOR MANUFACTURING MASTER MOLD, MASTER MOLD MANUFACTURED THEREBY, METHOD FOR MANUFACTURING TRANSPARENT PHOTOMASK, TRANSPARENT PHOTOMASK MANUFACTURED THEREBY, AND METHOD FOR FORMING CONDUCTIVE MESH PATTERN USING TRANSPARENT PHOTOMASK

TECHNICAL FIELD

This application is a National Stage Entry of International Application No. PCT/KR2015/001489, filed Feb. 13, 2015, and claims the benefit of and priority to Korean Application No. 10-2014-0016625, filed Feb. 13, 2014, both of which are incorporated herein by reference in their entirety for all purposes as if fully set forth herein.

The present invention relates to a method for manufacturing a master mold, a master mold manufactured by the method, a method for manufacturing a transparent photomask, a transparent photomask manufactured by the method, and a method for manufacturing a conductive mesh pattern by using the transparent photomask.

BACKGROUND ART

A portable terminal, such as a smart phone, an Internet device, and a portable game device, requires a slimmer appearance in order to improve portability of a user.

The portable terminals have limited sizes to be inconvenient to perform a user desired function by using a menu key, a number key, and a direction key, so that the portable terminal is currently configured so as to enable a user to directly select a menu item displayed on a screen by using a touch screen while the user views a screen.

The touch screen enables a user to touch a menu item displayed on a screen while viewing the screen to perform a desired function, so that the touch screen needs to be formed of a transparent material, and includes a touch electrode for detecting a touch input of the user.

The touch electrode is generally formed of two electrode lines having a crossing structure in the touch screen, and the two touch electrode lines may be formed in separate sheets, or in one sheet to determine a touch input of a user.

A touch screen having a lattice structure adopts a capacitive method, and a sensor electrode pattern is formed of a plurality of crossing first conductive-side lines and second conductive-side lines. When a touch object approaches the touch screen having the lattice structure, the first and second conductive-side lines, which are connected horizontally and vertically to each other, collect capacitance charged at the approach point, and the touch screen analyzes a collected signal and detects a touch input.

An electrode of the touch screen adopts a transparent metal oxide, such as an indium tin oxide (ITO) having higher electric resistance than that of a conductive metal, but having high optical transmittance.

The transparent metal oxide does not have a problem in a device having a small surface area because a work function is large, and electric conductivity is not relatively high, but there is a disadvantage in that when the surface area is increased, a voltage drop is generated.

When the transparent metal oxide is formed on a transparent film, such as a PET film, surface damage to a film is generated in proportion to a deposition time, and anion impact is generated, so that it is difficult to make a large touch screen.

In order to overcome the problem, US Patent Publication No. 2010-0156840 discloses a touch screen sensor for detecting a touch input by using a touch electrode having a mesh structure.

However, the touch electrode having the mesh structure may be visually recognized, or a Moiré effect may be exhibited by the mesh pattern.

When a line width of the touch electrode having the mesh structure is decreased, visual recognition and the Moiré effect are decreased, but there is a limit in an implementable line width of a micro pattern, and a method of implementing an ultrafine mesh structure having a line width in a submicrometer scale, which is less than 1 μm, has large processing cost, so that there is a problem in mass manufacturing and making the touch electrode large.

Accordingly, research on a reasonable manufacturing method capable of implementing an ultrafine mesh structure having a line width in a submicrometer scale, which is less than 1 μm, is demanded.

DISCLOSURE

Technical Problem

The present invention provides a method for manufacturing a master mold, a master mold manufactured by the method, a method for manufacturing a transparent photomask, a transparent photomask manufactured by the method, and a method for manufacturing a conductive mesh pattern by using the transparent photomask.

Technical Solution

The present invention provides a method for manufacturing a master mold, including: a) forming a first photosensitive material layer on a base substrate; b) forming a first photosensitive material pattern layer by making a transparent photomask, in which linear patterns are carved, be in contact with an upper surface of the first photosensitive material layer; c) forming a second photosensitive material layer on the base substrate provided with the first photosensitive material pattern layer; d) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate; e) etching portions of the base substrate on which the first photosensitive material pattern layer and the second photosensitive material pattern layer are not formed; and f) removing the first photosensitive material pattern layer and the second photosensitive material pattern layer.

Further, the present invention provides a master mold manufactured according to the method of manufacturing the master mold, and having convex mesh patterns having a line width of 100 nm or more and 900 nm or less.

The present invention provides a method for manufacturing a transparent photomask, including: 1) forming a first photosensitive material layer on a base substrate; 2) forming a first photosensitive material pattern layer by making a transparent photomask, in which linear patterns are carved, be in contact with an upper surface of the first photosensitive material layer; 3) forming a second photosensitive material layer on the base substrate provided with the first photosensitive material pattern layer; 4) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate; 5) etching portions of the base substrate on which the first photosensitive material pattern layer and the second photosensitive material pattern layer are not formed; 6) manufacturing a master mold having convex mesh patterns by removing the first photosensitive material pattern layer and the second photosensitive material pattern layer; 7) forming a transparent resin layer on the master mold; and 8) removing the transparent resin layer from the master mold.

Further, the present invention provides a transparent photomask manufactured by the method of manufacturing the transparent photomask, and having concave mesh patterns having a line width of 100 nm or more and 900 nm or less.

Further, the present invention provides a method of manufacturing a conductive mesh pattern, including: ⓐ forming a photosensitive material layer on a conductive layer of a base substrate including the conductive layer; ⓑ forming a photosensitive material mesh pattern layer by making the transparent photomask be in contact with an upper surface of the photosensitive material layer; ⓒ etching a portion of the conductive layer on which the photosensitive material mesh pattern layer is not formed; and ⓓ removing the photosensitive material mesh pattern layer to manufacture conductive mesh patterns.

Advantageous Effects

According to the present invention, it is possible to manufacture an electrode having an ultrafine mesh structure having a line width in a submicrometer scale through a simple photo process.

The electrode having the ultrafine mesh structure having a line width in a submicrometer scale manufactured according to the present invention may overcome a limit of an intrinsic surface resistance value of an oxide layer compared to an existing metal oxide-based transparent electrode on a thin film, so that it is very easy to apply the electrode to a large area transparent electrode.

In a case where a plastic base substrate is used, even when the base substrate is curved or bent due to a structure of fine lines, it is possible to effectively distribute a locally concentrated stress to the base substrate, so that the electrode may be easily applicable to a flexible electronic device.

The mesh electrode manufactured by the manufacturing method of the present invention is very easily used in an electrode structure of a touch panel of an electronic device.

The present invention may induce uniform contact of a photosensitive layer by using a soft phase difference mask, so that it is easy to form a pattern in a cylindrical mold having a plane, a non-plane, or a curved surface, and thus it is possible to easily apply a net mesh structure in a submicrometer scale by an automation process, such as a roll to roll process based on a cylindrical roll mold.

The present invention may form and overlap large area patterns having various sizes by using a transparent flexible base substrate as a photomask, or divide or independently form patterns having different shapes on a cylindrical curved surface of a cylindrical mold, thereby improving a degree of freedom of a process.

The present invention may easily manufacture a master mold in which convex submicrometer mesh patterns are carved.

The present invention may easily manufacture a transparent photomask in which concave submicrometer mesh patterns are carved.

EXPLANATION OF REFERENCE NUMERALS AND SYMBOLS

Figure 1:
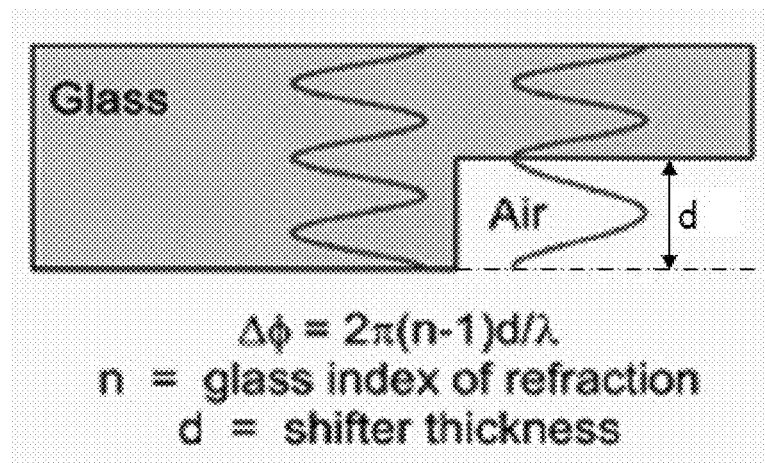
FIGS. 1 and 2 describe a principle of phase shift lithography.

1: Master mold having convex mesh patterns
5: Transparent resin layer
10: Transparent photomask having concave mesh patterns
20: 100: Base substrate
30: Conductive layer
40: Photosensitive material layer 50: Photosensitive material mesh pattern layer
60: Conductive mesh pattern
70: Opaque pattern layer
80: Additional photosensitive material pattern layer
100: 100: Base substrate
200: Conductive layer
310: First photosensitive material layer
330: First photosensitive material pattern layer
400: Transparent photomask in which linear patterns are carved
510: Second photosensitive material layer
530: Second photosensitive material pattern layer
600: Conductive mesh pattern
800: Shadow mask or screen mask
900: Router pattern

MODE FOR INVENTION

Hereinafter, the present invention will be described in detail.

An electrode having a net structure having a line width in a submicrometer scale has an electrode structure capable of minimizing a line width and maximizing transmittance in forming a conductive pattern by using a metal having high conductivity, and is easily applied to a large area and flexible electronic device, compared to an existing transparent electrode based on a metal oxide, such as an indium tin oxide (ITO). When electrode having a conductive layer is adapted to a flexible electronic device, the conductive layer is inevitably broken due to a large difference in a mechanical elastic modulus between a flexible base substrate and the conductive layer. When the electrode having the net structure having a line width in a submicrometer scale is applied to a flexible electronic device, and even when the base substrate is bent or curved by the structure of the fine line, it is possible to effectively disperse a locally concentrated stress to the base substrate, so that the electrode may be very easily used to be applied to the flexible electronic device.

A technology for manufacturing an existing nano structure has a limit in manufacturing the electrode, so that a new technology has been attempted. A micro/nano patterning technology using soft lithography is representatively used, and the soft lithography method refers to a new transfer method for making a pattern or a structure by using a flexible organic material without a complex device used in the existing photography.

In order to manufacture a mesh structure having a line width in a submicrometer scale by using phase shift lithography, a method for manufacturing a phase shift photolithography mask by controlling an interval between concavo-convex patterns having a checker board shape to have a submicro regime by using electro-beam lithography has been suggested.

Figure 2:
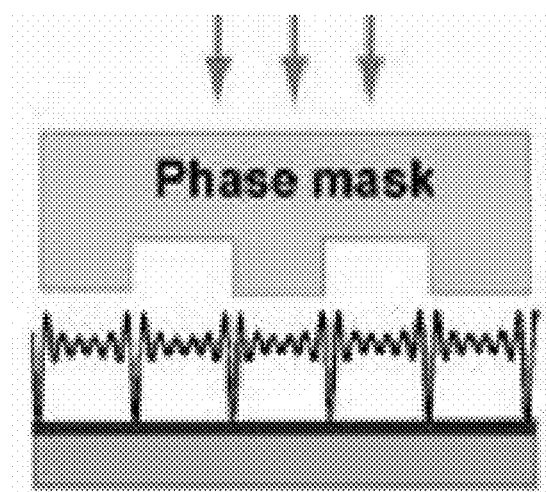

When a flexible base substrate formed with a pattern is used as a photomask, a phase difference of incident UV light is generated due to a difference in a refractive index between a medium (ex. glass n=1.45) and air (n=1.0) at a boundary interface between a pattern convex portion and a pattern concave portion as illustrated in FIG. 1. When a phase difference considering a height d of the pattern and a wavelength of incident UV light becomes an integer ratio of $2\pi$, destructive interference is locally generated, so that the phase shift lithography uses a phenomenon in which intensity of UV light becomes a null point close to 0 in a local region of the convex pattern boundary or concave pattern boundary as illustrated in FIG. 2. Accordingly, it is possible to easily obtain a pattern of a submicrometer scale which is 1 micro or lower even by using a general cheap UV lamp.

Considering a resolution (R=kl/NA (k: a process index, l: a wavelength of a light source, NA: an aperture ratio of a lens) of a pattern obtainable by using a general blank mask, the phase shift lithography has an advantage in that it is possible to easily obtain a pattern of a submicrometer scale by using a cheap UV lamp even without using an expensive extreme UV light source. Further, the phase shift lithography has an advantage in that when a phase difference photomask is formed of a flexible material, a cylindrical mold has a very high adhesion property by a property of a flexible base substrate, so that it is possible to form a uniform pattern over an entire region of a plane or non-plane (curved) base substrate.

It is very easy to manufacture a linear pattern having a line width w (<1 μm) having a submicro regime by using the phase shift lithography, but in order to manufacture a mesh structure in which patterns having an ultrafine line width to be applied to a transparent electrode are connected with and cross each other, it is necessary to manufacture a pattern base mask so that an interval d between the patterns is similar to the line width w (d≈w). The reason is that in the phase shift lithography, the pattern is patterned in a structure in which the patterns are closed along corners by a method of inducing sensitization of the pattern by a near field locally exhibiting destructive interference at a boundary interface of corners of the patterns having a three-dimensional convex and concave shape of the phase difference photomask. Accordingly, in order to implement a mesh structure in which the patterns are connected with and cross each other, there is technical difficulty in that an interval between unit patterns of the phase difference photomask needs to be controlled to have a submicro regime.

Figure 3:
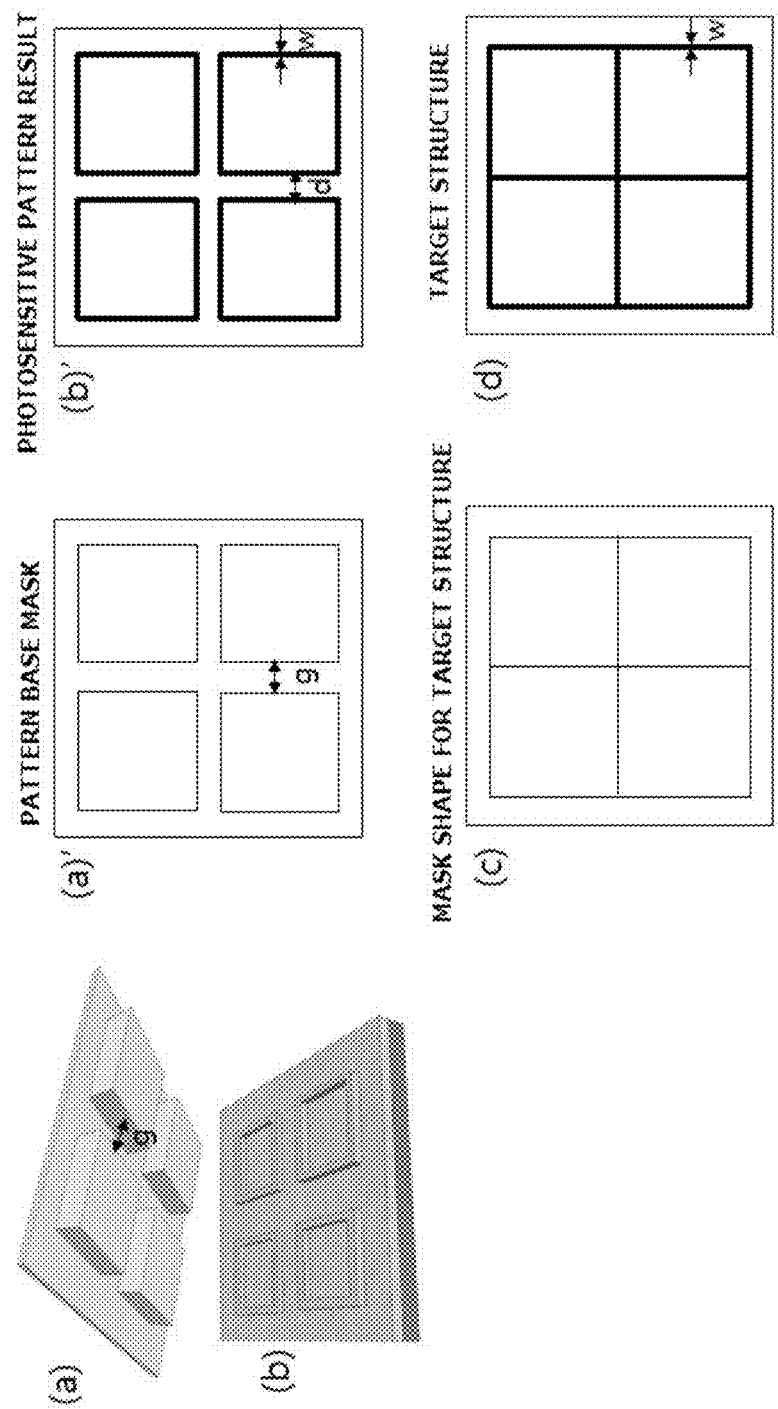
FIG. 3 illustrates difficulty in manufacturing a mesh pattern of submicrometer based on optical phase shift lithography.

By describing FIG. 3, when a phase difference photomask illustrated in (a) of FIG. 3 is used in order to manufacture a mesh pattern, an interval d between quadrangular patterns illustrated in (b) of FIG. 3 is increased in proportion to an interval g between convex pattern of the phase difference photomask. In order to overcome the problem and manufacture the mesh pattern, when the interval g between the convex patterns of the phase difference photomask is controlled to have a size of a submicro less than 1 μm as illustrated in (c) of FIG. 3, it is possible to manufacture the mesh pattern illustrated in (d) of FIG. 3.

There is a disadvantage in that in order to control the interval g between the convex pattern of the phase difference photomask to have the size of a submicro less than 1 μm as illustrated in (c) of FIG. 3, it is necessary to use expensive ultrafine patterning equipment, such as an electro-beam or an ion beam, a manufacturing process has high difficulty, and the method is difficult to be applied to making the electrode be large due to a pattern process based on high vacuum.

The present invention provides a method for manufacturing a master mold, including: a) forming a first photosensitive material layer on a base substrate; b) forming a first photosensitive material pattern layer by making a transparent photomask, in which linear patterns are carved, be in contact with an upper surface of the first photosensitive material layer; c) forming a second photosensitive material layer on the base substrate provided with the first photosensitive material pattern layer; d) making the transparent photomask formed with the carved linear pattern be in contact with an upper surface of the second photosensitive material layer, so that the linear pattern of the first photosensitive material pattern layer crosses the linear pattern of the transparent photomask to form a second photosensitive material pattern layer on the base substrate; e) etching portions of the base substrate on which the first photosensitive material pattern layer and the second photosensitive material pattern layer are not formed; and f) removing the first photosensitive material pattern layer and the second photosensitive material pattern layer.

Step a) is a step of forming the first photosensitive material layer on the base substrate.

The type of base substrate is not specially limited, but may be selected from the base substrates generally used in the art. Particularly, the base substrate may be a transparent base substrate, for example, the transparent base substrate may include at least one of quartz, glass, and plastic, or be formed of at least one thereof.

The base substrate may include quartz or be formed of quartz. The quartz has excellent transmittance of a wavelength in a UV region band, excellent wear resistance, and an excellent mechanical property. In this case, it is possible to secure transmittance of UV for inducing curing by using a UV curing resin when a shape of a master pattern is copied later.

A thickness of the base substrate is not specially limited, but when the plastic base substrate is manufactured based on roll to roll using a mold or a phase difference mask, a thickness of the base substrate may be 40 µm or more and 400 µm or less.

The base substrate in step a) may include a conductive layer provided on one surface thereof.

The conductive layer may include at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

The conductive layer may include a transparent metal oxide.

The type of transparent metal oxide is not specially limited, but may be selected from the transparent metal oxides generally used in the art. For example, the transparent metal oxide may include at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

A stacking method of the conductive layer is not specially limited, but may be, for example, thermal deposition, sputtering, electro-beam deposition, a lamination processing method, or a solution coating method.

When a solution coating method is used as the stacking method of the conductive layer, the conductive layer may be formed on the base substrate by using at least one of a conductive metal precursor, a conductive metal oxide precursor, nano particles, nano lines, conductive textile, and a conductive polymer.

A thickness (height) of the conductive layer is not specially limited, but may be 5 nm or more and 10 µm or less.

The first photosensitive material layer formed on the conductive layer may be formed by applying a photosensitive material composition onto the conductive layer. The type of photosensitive material included in the photosensitive material composition is not specially limited, but the photosensitive material has different solubility to a developer according to exposure, and when the photosensitive material is cured by a thermal treatment after the pattern is formed, it is possible to establish a more stable processing condition.

The photosensitive material composition may be a positive photosensitive material composition or a negative photosensitive material composition, and is not specially limited. The photosensitive material composition may be a positive photosensitive material composition.

A content of solid of the photosensitive material composition may be varied according to viscosity and solid of the photosensitive material used, but for example, 10 weight % or more and 60 weight % or less based on a total weight of the photosensitive material composition.

A thickness of the first photosensitive material layer may be 0.01 µm or more and 10 µm or less.

Step b) is a step of forming a first photosensitive material pattern layer by making a transparent photomask, in which linear patterns are carved, be in contact with an upper surface of the first photosensitive material layer.

The transparent photomask may be a transparent photomask in which a linear pattern is convexly carved.

The transparent photomask may be a phase difference soft mask, and particularly, the mask may be a contact mask made of a soft material having a concavo-convex shape with a cycle of a micrometer size.

The transparent photomask in which the convex linear patterns are carved may have a linear recess and a linear protrusion. In this case, a line width of the protrusion and a line width of the recess may be the same as or different from each other, and a line width of the protrusion and a line width of the recess may be the same as each other.

In the transparent photomask, when a line width of the protrusion and a line width of the recess may be the same as each other, a line width of one protrusion and a line width of one recess may be defined as a cycle of the concavo-convex portion. For example, when a cycle of the concavo-convex portion of the transparent photomask is 80 µm, the cycle may mean the protrusion having a line width of 40 µm and the recess having a line width of 40 µm.

The cycle of the concavo-convex portion of the transparent photomask determines a pitch of a photosensitive material pattern formed by the transparent photomask. For example, when the cycle of the concavo-convex portion of the transparent photomask is 80 µm, a pitch of a photosensitive material pattern formed by the transparent photomask may be 40 µm. In this case, the pitch of a photosensitive material pattern means a distance between a center line in a longitudinal direction of a line width of any one pattern and a center line in a longitudinal direction of a line width of another pattern adjacent to the one pattern.

As long as a material of the transparent photomask is a flexible material having high transmissivity and low Young's modulus, the material of the transparent photomask is not specially limited, but the transparent photomask may include, for example, at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof. Particularly, the transparent photomask may include a PDMS-based polymer, but is not essentially limited thereto.

A line width of the linear pattern convexly carved in the transparent photomask may be varied according to a pattern desired to be finally implemented. In consideration of a wavelength of a UV light source used, formation of a near field optical pattern caused by destructive interference, and dropping of a depressed portion of the concavo-convex portion of the pattern by the flexible material of the transparent photomask, the line width of the linear pattern convexly carved in the transparent photomask may be 2 μm or more and 500 μm or less.

The cycle of the concavo-convex portion formed in the transparent photomask may be designed and predicted through Equations 1 and 2 based on a grid interval determining transmittance and a surface resistance value of the manufactured mesh electrode, and has a value caused by a line width of the mesh electrode and a characteristic of a material of the used metal of the electrode. The cycle of the concavo-convex portion of the transparent photomask may be 20 μm or more and 160 μm or less.

$$R_{S,TOT} = \xi \frac{\rho_G}{t_G f_F} \quad \text{(Equation 1)}$$

$$T_{TOT} = T_{sub} \times (1 - f_F)^2 \quad \text{(Equation 2)}$$

In this case, $p_G$ and $t_G$ represent resistivity and a thickness of a conductive grid, respectively, $\xi$ is a correction coefficient of a process caused by a process of forming a metal layer, and $f_F$ represents an area ratio by which the metal layer occupies the substrate, that is, a filling factor. $T_{sub}$ represents transmissivity of the base substrate, and $T_{TOT}$ represents final transmissivity of a base substrate including a conductive mesh.

A height of the linear convex pattern of the transparent photomask, that is, a height of the protrusion, may be 50 nm or more and 500 μm or less.

When the transparent photomask is in contact with the upper surface of the first photosensitive material layer, a surface of the transparent photomask, in which the linear patterns are carved, may be in contact with the upper surface of the first photosensitive material layer. In this case, a phase difference of ultraviolet rays incident into the transparent photomask is generated due to a difference between a refractive index of the transparent photomask and a refractive index of air, and intensity of ultraviolet rays may be a null point close to 0 at a boundary of the protrusion and the recess of the pattern, that is, an interface in which the transparent photomask is in contact with air, due to destructive interference.

Step b) may include: b-1) irradiating ultraviolet rays onto the transparent photomask after making the transparent photomask be in contact with the upper surface of the first photosensitive material layer;

b-2) removing the transparent photomask, developing the first photosensitive material layer by using a developer, and forming a first photosensitive material pattern layer; and b-3) curing the formed first photosensitive material pattern layer.

In step b-1), the first photosensitive material layer is divided into a portion, to which ultraviolet rays are irradiated, and a portion, to which ultraviolet rays are not irradiated, by the transparent photomask, and the portion of the first photosensitive material layer, to which ultraviolet rays are irradiated, may have high solubility to the developer.

In step b-1), intensity of the irradiated ultraviolet rays is not specially limited, but, may be, for example, 10 mJ/cm² or more and 200 mJ/cm² or less.

As long as a developer is capable of melting the portion of the first photosensitive material layer, to which ultraviolet rays are irradiated, the developer used in step b-2) is not specially limited, but the developer may be an alkali developer, and for example, potassium hydroxide (KOH).

Step b) may further include drying the formed first photosensitive material pattern layer after step b-2). In this case, a solvent and the like included in the first photosensitive material pattern layer may be gasified.

As long as a temperature enables the solvent and the like included in the first photosensitive material pattern layer to be gasified, a temperature for drying the first photosensitive material pattern layer is not specially limited.

In step b-3), the cured first photosensitive material pattern layer may be hardened and fixated.

In step b-3), the temperature for curing the first photosensitive material pattern layer may be 150° C. or more and 250° C. or less.

The first photosensitive material pattern layer formed in step b) may be the cured first photosensitive material pattern layer. In this case, when a process of forming a second photosensitive material pattern layer on the conductive layer provided with the first photosensitive material pattern layer is performed, there may be less or no damage to the pattern, such as the cured first photosensitive material pattern layer is separated or melted.

A line width of the linear pattern of the first photosensitive material pattern layer may be 100 nm or more and 900 nm or less.

Step c) is a step of forming a second photosensitive material layer on the base substrate provided with the first photosensitive material pattern layer.

A thickness of the second photosensitive material layer may be the same as or close to the thickness (height) of the first photosensitive material pattern layer. The thickness of the second photosensitive material layer may be varied according to the thickness (height) of the first photosensitive material pattern layer, but may be, for example, 0.01 μm or more and 10 μm or less.

The second photosensitive material layer may be formed by applying a photosensitive material composition onto the conductive layer provided with the first photosensitive material pattern layer.

The photosensitive material composition forming the second photosensitive material layer may be the same as or different from the photosensitive material composition forming the first photosensitive material layer.

Step d) is a step of making the transparent photomask, in which linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate.

In step d), the transparent photomask, in which the linear patterns are carved, is in contact with the upper surface of the second photosensitive material layer, so that the linear pattern of the first photosensitive material pattern layer crosses the linear pattern of the transparent photomask, and here, "cross" means that the transparent photomask, in which the linear patterns are carved, is in contact with the upper surface of the second photosensitive material layer so that the linear pattern of the first photosensitive material pattern layer is orthogonal to or has a predetermined angle with the linear pattern of the phase difference soft mask.

Step d) may include: d-1) irradiating ultraviolet rays onto the transparent photomask after making the transparent photomask be in contact with the upper surface of the second photosensitive material layer;

d-2) removing the transparent photomask, developing the second photosensitive material layer by using a developer, and forming a second photosensitive material pattern layer; and d-3) curing the formed second photosensitive material pattern layer.

Step d) may further include drying the formed second photosensitive material pattern layer after step d-2).

Steps d-1), d-2), and d-3), and the drying step may quote the descriptions of steps b-1), b-2), and b-3), and the drying step, and the steps may be independently performed under the same condition as or different conditions from those of steps b-1), b-2), and b-3), and the drying step, respectively.

The second photosensitive material pattern layer formed in step d) may be the cured second photosensitive material pattern layer.

The transparent photomask in step d) may quote the description of the aforementioned transparent photomask.

The transparent photomask in step d) may be the same as or different from the transparent photomask in step b).

A line width of the linear pattern of the second photosensitive material pattern layer may be 100 nm or more and 900 nm or less.

According to another particular example of the present invention, an additional submicro pattern or micro pattern may be manufactured by patterning the photosensitive material on the base substrate three or more times.

After step d), the method may further include: forming a third photosensitive material layer on the base substrate provided with the first photosensitive material pattern layer and the second photosensitive material pattern layer; and forming a third photosensitive material pattern layer on the base substrate.

A thickness of the third photosensitive material layer may be the same as or close to the thicknesses (heights) of the first photosensitive material pattern layer and the second photosensitive material pattern layer. The thickness of the third photosensitive material pattern layer may be varied according to the thicknesses (heights) of the first photosensitive material pattern layer and the second photosensitive material pattern layer, but may be, for example, 0.01 µm or more and 10 µm or less.

The third photosensitive material layer may be formed by applying a photosensitive material composition onto the base substrate provided with the first photosensitive material pattern layer and the second photosensitive material pattern layer.

The photosensitive material composition forming the third photosensitive material layer may be the same as or different from the photosensitive material composition forming at least one of the first photosensitive material layer and the second photosensitive material layer.

In another exemplary embodiment of the present invention, the step of forming the third photosensitive material pattern layer may be a step of making the transparent photomask, in which the linear patterns are carved, be in contact with an upper surface of the third photosensitive material layer, so that at least one of the linear pattern of the first photosensitive material pattern layer and the linear pattern of the second photosensitive material pattern layer crosses or is in parallel to the linear pattern of the transparent photomask to form the third photosensitive material pattern layer on the conductive layer.

By adding the step, it is possible to manufacture the mesh electrode, in which the pattern shape having a triangular, a rectangular, square, or polygonal arrangement and the like is formed, by overlapping or connecting the submicro patterns or micro patterns.

Step e) is a step of manufacturing conductive mesh patterns by etching portions of the base substrate on which the first photosensitive material pattern layer and the second photosensitive material pattern layer are not formed.

The etch process in step e) may be performed by using a general dry etch or wet etch method, but considering reliability of the conductive pattern having a micro line width and a defect of a product, the etch process may be preferably performed by a dry etch method.

When an additional photosensitive material pattern layer is formed after step d), step e) may be a step of etching portions of the conductive layer in which the first photosensitive material pattern layer, the second photosensitive material pattern layer, and the additional photosensitive material pattern layer are not formed.

When the third photosensitive material pattern layer is formed after step d), step e) may be a step of etching portions of the conductive layer in which the first photosensitive material pattern layer, the second photosensitive material pattern layer, and the third photosensitive material pattern layer are not formed.

Step f} is a step of removing the first photosensitive material pattern layer and the second photosensitive material pattern layer.

The method of removing the first and second photosensitive material pattern layers is not specially limited, and may adopt a method generally used in the art.

When an additional photosensitive material pattern layer is formed after step d), the first photosensitive material pattern layer, the second photosensitive material pattern layer, and the additional photosensitive material pattern layer may be removed in step f).

When the third photosensitive material pattern layer is formed after step d), the first photosensitive material pattern layer, the second photosensitive material pattern layer, and the third photosensitive material pattern layer may be removed in step f).

The method may further include: g) etching a portion of the base substrate on which the conductive mesh pattern is not formed; and h) removing the conductive mesh pattern after step f).

The etch process in step g) may be performed by using a general dry etch or wet etch method, but may be preferably performed by a dry etch method.

The condition of the etch process in step g) may be the same as or different from the condition of the etch process of step e). In steps g) and e), considering that targets to be etched are different from each other, the etch process conditions of steps g) and e) may be different from each other.

The method of removing the conductive mesh pattern is not specially limited, and may adopt a method generally used in the art.

The condition of the process of removing the photosensitive material layer in step f) may be the same as or different from the condition of the process of removing the conductive mesh pattern of step h). In steps f) and h), considering that targets to the removed are different from each other, the process conditions of steps f) and h) may be different from each other.

Figure 4:
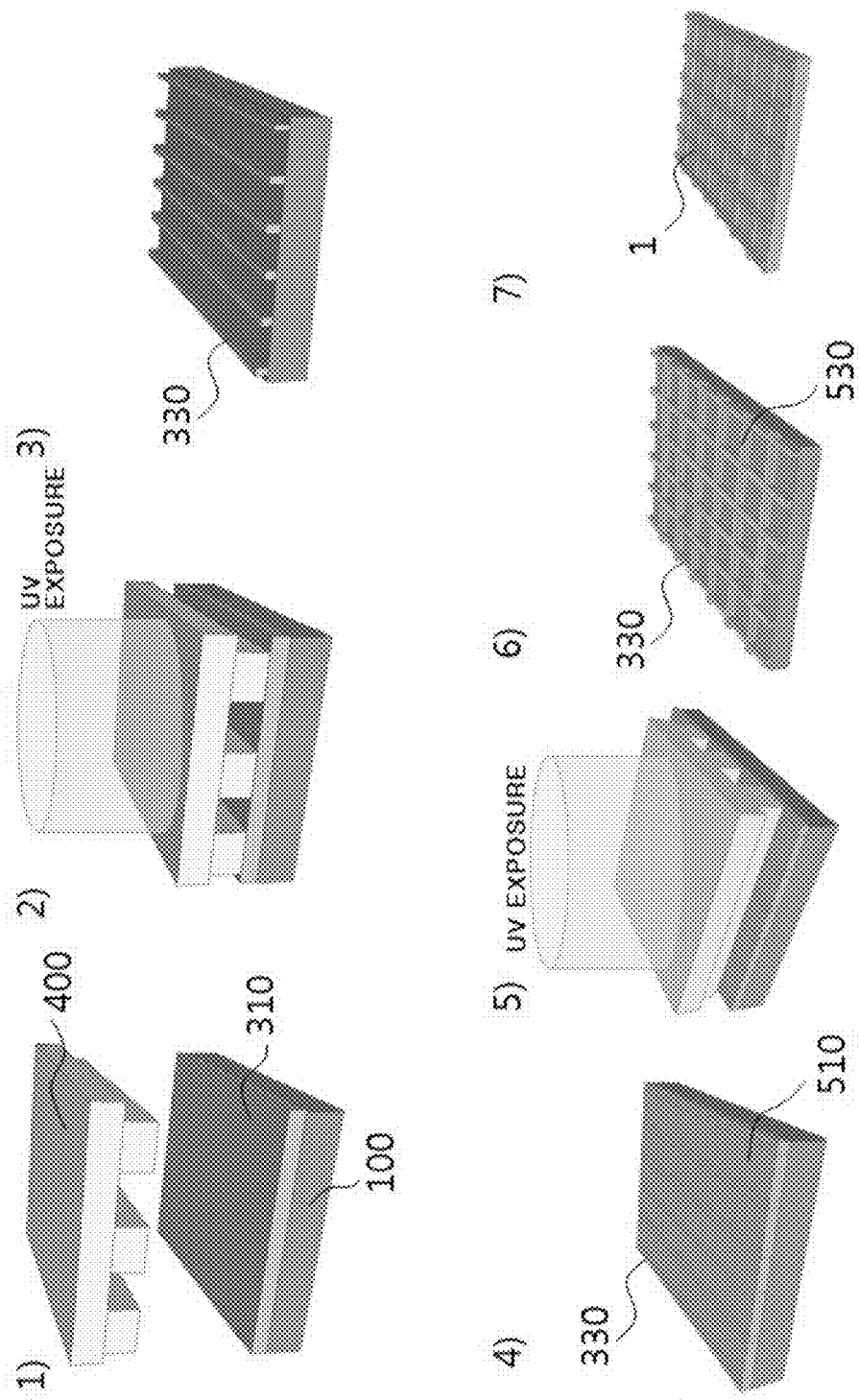
FIG. 4 is a flowchart of a method for manufacturing a master mold according to a first exemplary embodiment of the present invention.

As illustrated in FIG. 4, a method for manufacturing a master mold according to a first exemplary embodiment of the present invention may include: a) forming a first photosensitive material layer 310 on a base substrate 100; b) forming a first photosensitive material pattern layer 330 by making a transparent photomask 400, in which linear patterns are carved, be in contact with an upper surface of the first photosensitive material layer 310; c) forming a second photosensitive material layer 510 on the base substrate provided with the first photosensitive material pattern layer 330; d) making the transparent photomask 400, in which the linear patterns are carved, be in contact with an upper surface of the second photosensitive material layer 510, so that the linear pattern of the first photosensitive material pattern layer crosses the linear pattern of the transparent photomask to form the second photosensitive material pattern layer 530 on the base substrate; e) etching portions of the base substrate on which the first photosensitive material pattern layer 330 and the second photosensitive material pattern layer 530 are not formed; and f) removing the first photosensitive material pattern layer and the second photosensitive material pattern layer to manufacture a master mold.

Figure 5:
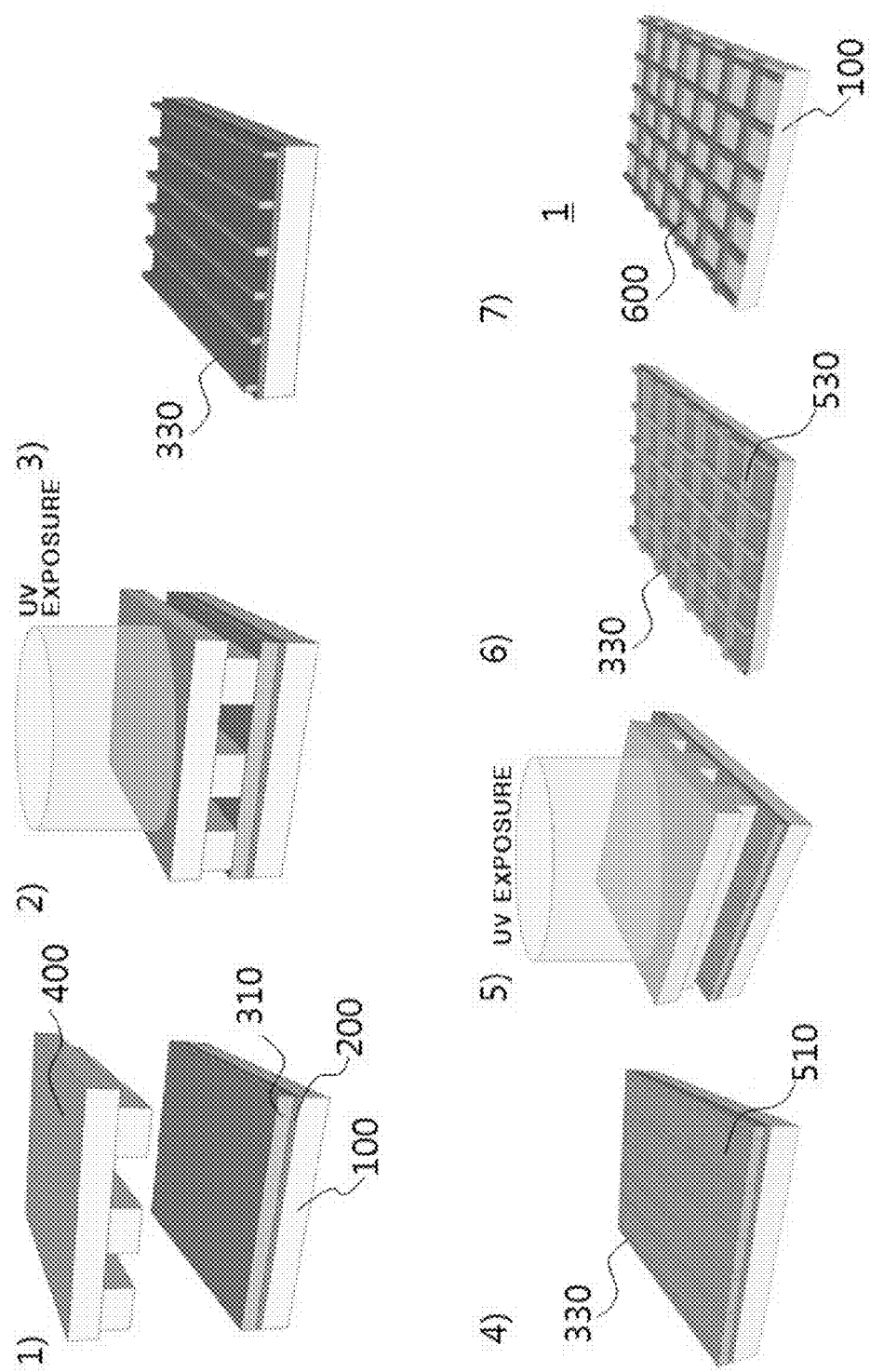
FIG. 5 is a flowchart of a method for manufacturing a master mold according to a second exemplary embodiment of the present invention.

As illustrated in FIG. 5, a method for manufacturing a master mold according to a second exemplary embodiment of the present invention may include: a) forming a first photosensitive material layer 310 on a conductive layer 200 of a base substrate 100 including the conductive layer 200; b) forming a first photosensitive material pattern layer 330 by making a transparent photomask 400, in which linear patterns are carved, be in contact with an upper surface of the first photosensitive material layer 310; c) forming a second photosensitive material layer 510 on the base substrate provided with the first photosensitive material pattern layer 330; d) making the transparent photomask 400, in which the linear patterns are carved, be in contact with an upper surface of the second photosensitive material layer 510, so that the linear pattern of the first photosensitive material pattern layer crosses the linear pattern of the transparent photomask to form the second photosensitive material pattern layer 530 on the base substrate; e) forming a conductive mesh pattern 600 by etching portions of the conductive layer in which the first photosensitive material pattern layer 330 and the second photosensitive material pattern layer 530 are not formed; and f) removing the first photosensitive material pattern layer 330 and the second photosensitive material pattern layer 530 to manufacture a master mold.

Figure 6:
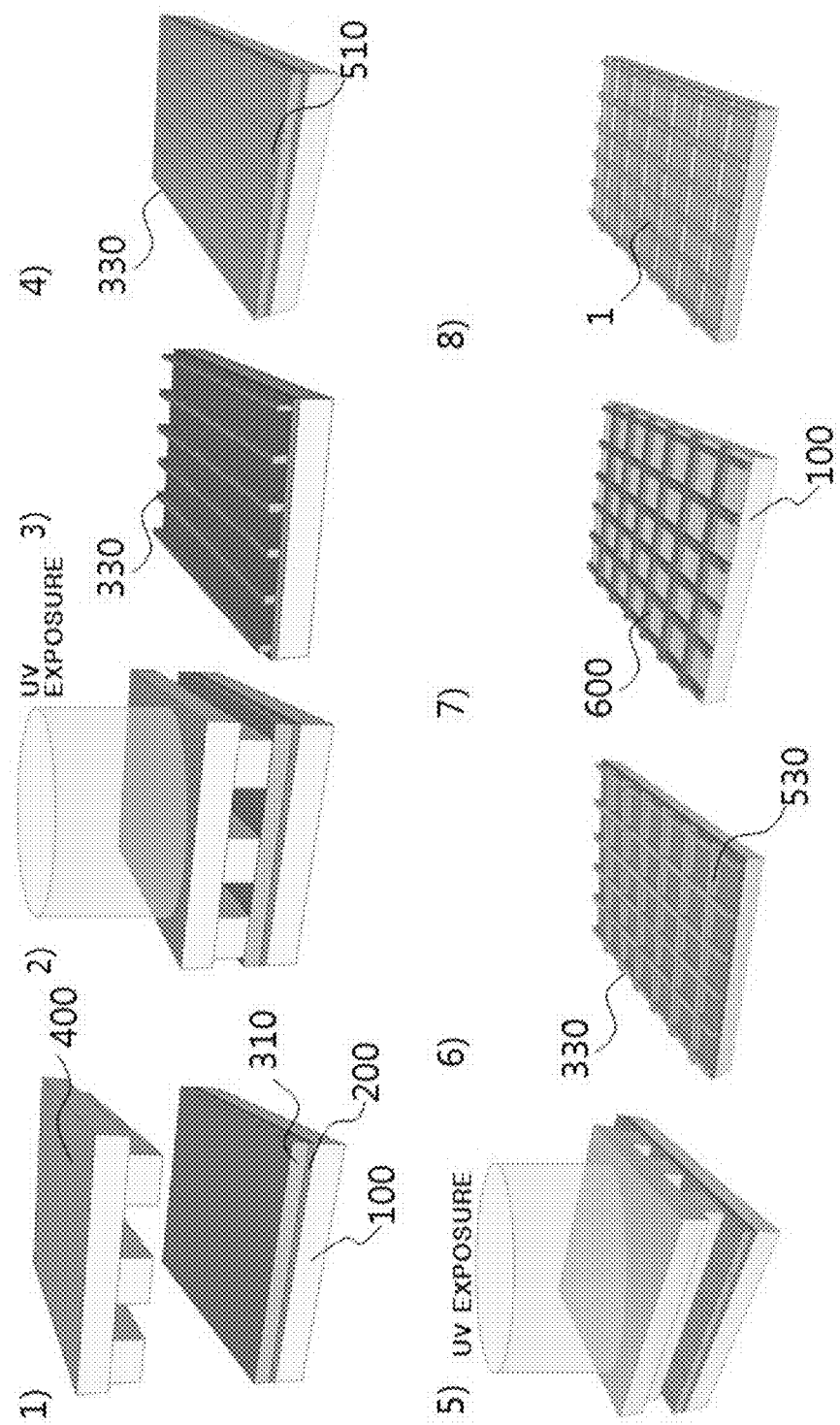
FIG. 6 is a flowchart of a method for manufacturing a master mold according to a third exemplary embodiment of the present invention.

As illustrated in FIG. 6, a method for manufacturing a master mold according to a third exemplary embodiment of the present invention may include: a) forming a first photosensitive material layer 310 on a conductive layer 200 of a base substrate 100 including the conductive layer 200; b) forming a first photosensitive material pattern layer 330 by making a transparent photomask 400, in which a linear patterns are carved, be in contact with an upper surface of the first photosensitive material layer 310; c) forming a second photosensitive material layer 510 on the base substrate provided with the first photosensitive material pattern layer; d) making the transparent photomask 400, in which the linear patterns are carved, be in contact with an upper surface of the second photosensitive material layer 510, so that the linear pattern of the first photosensitive material pattern layer crosses the linear pattern of the transparent photomask to form the second photosensitive material pattern layer 530 on the base substrate; e) forming a conductive mesh pattern 600 by etching portions of the conductive layer in which the first photosensitive material pattern layer 330 and the second photosensitive material pattern layer 530 are not formed; f) removing the first photosensitive material pattern layer 330 and the second photosensitive material pattern layer 530; and g) etching portions of the base substrate in which the conductive mesh patterns 530 are not formed; and h) removing the conductive mesh pattern 530 to manufacture a master mold.

The present invention provides a master mold which is manufactured by the method for manufacturing the master mold and has a convex mesh pattern having a line width of 100 nm or more and 900 nm or less.

A description of the master mold may quote the above description of the method for manufacturing the master mold.

The master mold may be a master mold having integrated convex mesh patterns or a master mold having convex conductive mesh patterns on the base substrate.

As illustrated in FIG. 4 or 6, the master mold may be a master mold 1 having an integrated convex mesh pattern, or a master mold 1 having a convex conductive mesh pattern 600 on the base substrate 100 as illustrated in FIG. 5.

The master mold may further include an additional sub-micro pattern or micro pattern formed through an additional photosensitive material pattern layer. Particularly, the mesh electrode may further include a router pattern layer.

The present invention provides a method for manufacturing a transparent photomask, including: 1) forming a first photosensitive material layer on a base substrate; 2) forming a first photosensitive material pattern layer by making a transparent photomask, in which linear patterns are carved, be in contact with an upper surface of the first photosensitive material layer; 3) forming a second photosensitive material layer on the base substrate provided with the first photosensitive material pattern layer; 4) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate; 5) etching portions of the base substrate on which the first photosensitive material pattern layer and the second photosensitive material pattern layer are not formed; 6) manufacturing a master mold having convex mesh patterns by removing the first photosensitive material pattern layer and the second photosensitive material pattern layer; 7) forming a transparent resin layer on the master mold; and 8) removing the transparent resin layer from the master mold.

A description of the method for manufacturing the transparent photomask may quote the above description of the method for manufacturing the master mold.

The base substrate of step 1) may include the conductive layer provided on one surface thereof, and step 5) may be a step of manufacturing the conductive mesh pattern by etching portions of the conductive layer in which the first photosensitive material pattern layer and the second photosensitive material pattern layer are not formed.

The method may further include: etching a portion of the base substrate on which the conductive mesh pattern is not formed; and removing the conductive mesh pattern after step 6).

After step 4), the method may further include: forming a third photosensitive material layer on the base substrate on which the first photosensitive material pattern layer and the second photosensitive material pattern layer are formed; and forming a third photosensitive material pattern layer on the base substrate.

Step 8) may be a step of manufacturing a transparent photomask having a concave mesh pattern by removing the transparent resin layer from the master mold, and after step 8), the method may further include disposing a shadow mask or a screen mask, in which through patterns are carved, on a surface of the transparent photomask in which the concave mesh patterns are carved, depositing an opaque material, and forming an opaque pattern layer.

As long as a material of the opaque pattern layer is opaque and is available for a deposition process, the material of the opaque pattern layer is not specially limited, but may be, for example, a metal or carbon-based material.

The pattern carved in the shadow mask or the screen mask is not specially limited, but for example, when the conductive layer has a mesh pattern for a touch panel, the pattern carved in the photomask may be a router pattern. The router pattern is a configuration connectable with a mesh pattern for a touch panel and connectable with an external flexible printed circuit board.

Figure 16:
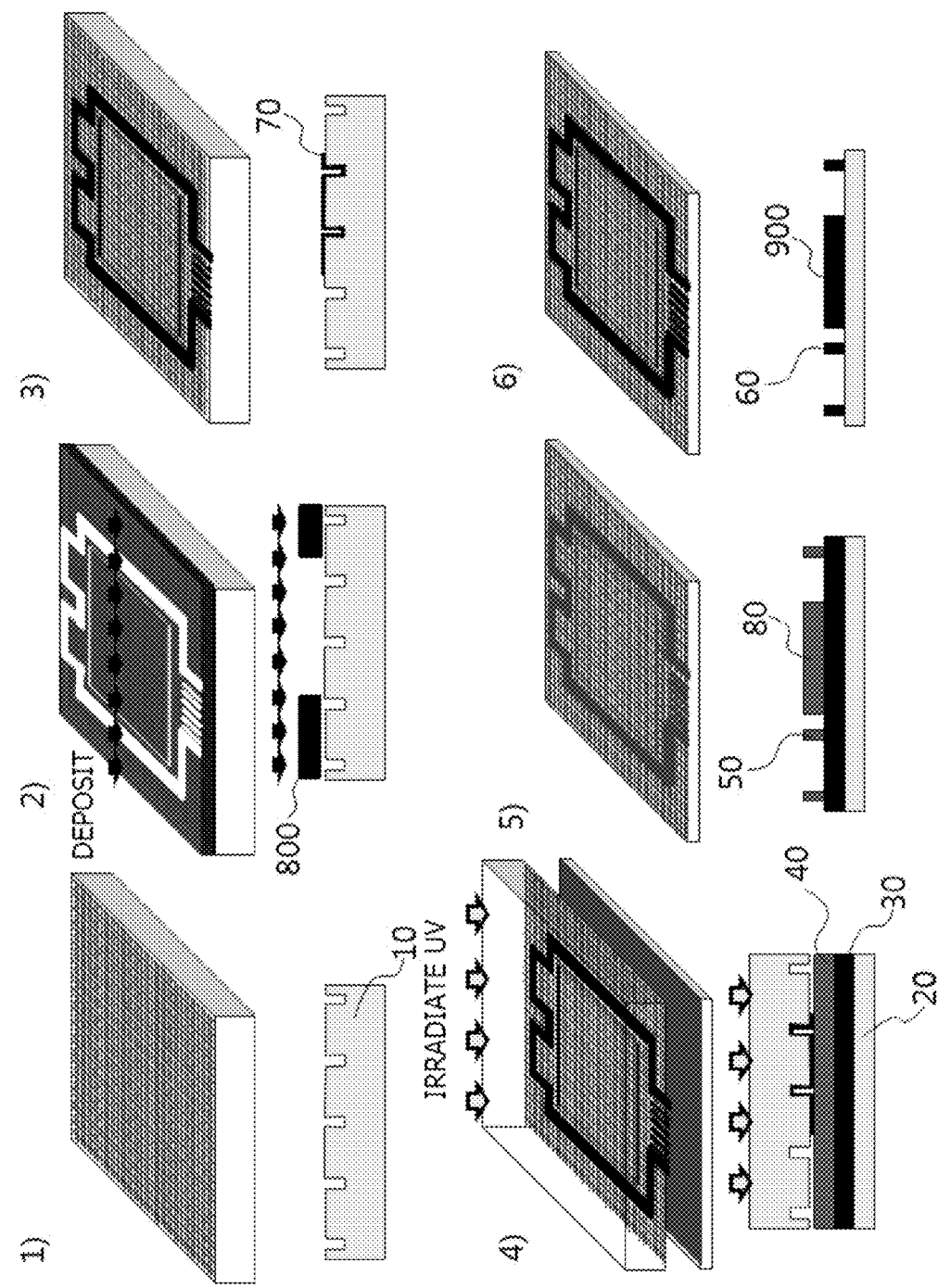
FIG. 16 is a flowchart of a method for adding a router pattern to a transparent photomask and manufacturing a conductive mesh pattern including the router pattern according to another exemplary embodiment of the present invention.

As illustrated in 1) to 3) of FIG. 16, it is possible to form an opaque pattern layer 70 by disposing a shadow mask or a screen mask 800, in which through patterns are carved, on a surface of a transparent photomask 10 in which concave mesh patterns are carved, and depositing an opaque material.

As long as the transparent resin layer may be transparent and maintain a form of the pattern when being removed from the master mold, the transparent resin layer is not specially limited. For example, the transparent resin layer may include, for example, at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof. Particularly, the transparent resin layer may include a PDMS-based polymer, but is not essentially limited thereto.

Figure 7:
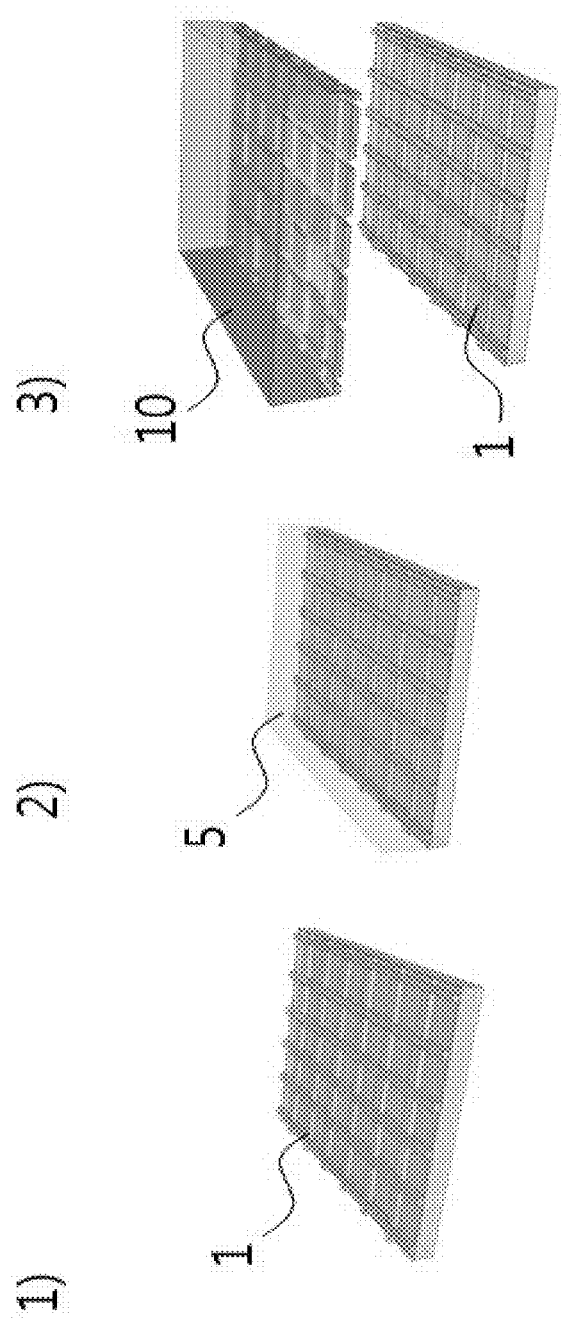
FIG. 7 is a flowchart of a method for manufacturing a transparent photomask according to an exemplary embodiment of the present invention.

As illustrated in FIGS. 4 and 7, a method for manufacturing a transparent photomask according to a first exemplary embodiment of the present invention may include: 1) forming a first photosensitive material layer 310 on a base substrate 100; 2) forming a first photosensitive material pattern layer 330 by making a transparent photomask 400, in which linear patterns are carved, be in contact with an upper surface of the first photosensitive material layer 310; 3) forming a second photosensitive material layer 510 on the base substrate provided with the first photosensitive material pattern layer 330; 4) making a transparent photomask 400, in which the linear patterns are carved, be in contact with an upper surface of the second photosensitive material layer 510, so that the linear pattern of the first photosensitive material pattern layer crosses the linear pattern of the transparent photomask to form a second photosensitive material pattern layer 530 on the base substrate; 5) etching portions of the base substrate on which the first photosensitive material pattern layer 330 and the second photosensitive material pattern layer 530 are not formed; 6) manufacturing a master mold 1 having convex mesh patterns by removing the first photosensitive material pattern layer 330 and the second photosensitive material pattern layer 530; 7) forming a transparent resin layer 5 on the master mold 1; and 8) removing the transparent resin layer from the master mold 1 to manufacture a transparent photomask 10 having concave mesh patterns.

As illustrated in FIGS. 5 and 7, a method for manufacturing a transparent photomask according to a second exemplary embodiment of the present invention may include: 1) forming a first photosensitive material layer 310 on a conductive layer 200 of a base substrate 100 including the conductive layer 200; 2) forming a first photosensitive material pattern layer 330 by making a transparent photomask 400, in which linear patterns are carved, be in contact with an upper surface of the first photosensitive material layer 310; 3) forming a second photosensitive material layer 510 on the base substrate provided with the first photosensitive material pattern layer; 4) making the transparent photomask 400, in which the linear patterns are carved, be in contact with an upper surface of the second photosensitive material layer 510, so that the linear pattern of the first photosensitive material pattern layer crosses the linear pattern of the transparent photomask to form a second photosensitive material pattern layer 530 on the base substrate; 5) manufacturing conductive mesh patterns 600 by etching portions of the conductive layer in which the first photosensitive material pattern layer 330 and the second photosensitive material pattern layer 530 are not formed; 6) manufacturing a master mold 1 having convex mesh patterns by removing the first photosensitive material pattern layer 330 and the second photosensitive material pattern layer 530; 7) forming a transparent resin layer 5 on the master mold 1; and 8) removing the transparent resin layer from the master mold 1 to manufacture a transparent photomask 10 having concave mesh patterns.

As illustrated in FIGS. 6 and 7, a method for manufacturing a transparent photomask according to a third exemplary embodiment of the present invention may include: 1) forming a first photosensitive material layer 310 on a conductive layer 200 of a base substrate 100 including the conductive layer 200; 2) forming a first photosensitive material pattern layer 330 by making a transparent photomask 400, in which linear patterns are carved, be in contact with an upper surface of the first photosensitive material layer 310; 3) forming a second photosensitive material layer 510 on the base substrate provided with the first photosensitive material pattern layer; 4) making the transparent photomask 400, in which the linear patterns are carved, be in contact with an upper surface of the second photosensitive material layer 510, so that the linear pattern of the first photosensitive material pattern layer crosses the linear pattern of the transparent photomask to form a second photosensitive material pattern layer 530 on the base substrate; 5) manufacturing conductive mesh patterns 600 by etching portions of the conductive layer in which the first photosensitive material pattern layer 330 and the second photosensitive material pattern layer 530 are not formed; 6) manufacturing a master mold 1 having convex mesh patterns by removing the first photosensitive material pattern layer 330 and the second photosensitive material pattern layer 530, etching a portion of the base substrate on which the conductive mesh pattern 530 is not formed, and removing the conductive mesh pattern 530; 7) forming a transparent resin layer 5 on the master mold 1; and 8) removing the transparent resin layer from the master mold 1 to manufacture a transparent photomask 10 having concave mesh patterns.

The present invention provides a transparent photomask which is manufactured by the method for manufacturing the transparent photomask and has a concave mesh pattern having a line width of 100 nm or more and 900 nm or less.

A description of the transparent photomask may quote the above description.

A depth of the concave mesh pattern may be 50 nm or more and 10 µm or less.

A pitch of the concave mesh pattern may be 2 µm or more and 500 µm or less. Particularly, a pitch of the concave mesh pattern may be 10 µm or more and 80 µm or less.

The transparent photomask may include at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof.

The transparent photomask may further include an opaque pattern layer provided on a surface of the transparent photomask in which the concave mesh patterns are carved.

The form of the opaque pattern layer is not specially limited, but, for example, when the conductive layer has a mesh pattern for a touch panel, the pattern carved in the photomask may be a router pattern.

The present invention provides a method for manufacturing conductive mesh patterns, including: ⓐ forming a photosensitive material layer on a conductive layer of a base substrate including the conductive layer; ⓑ forming a photosensitive material mesh pattern layer by making the transparent photomask of the present invention be in contact with an upper surface of the photosensitive material layer; ⓒ etching a portion of the conductive layer on which the photosensitive material mesh pattern layer is not formed; and ⓓ removing the photosensitive material mesh pattern layer to manufacture conductive mesh patterns.

A description of the method for manufacturing conductive mesh patterns may quote the above description.

Figure 8:
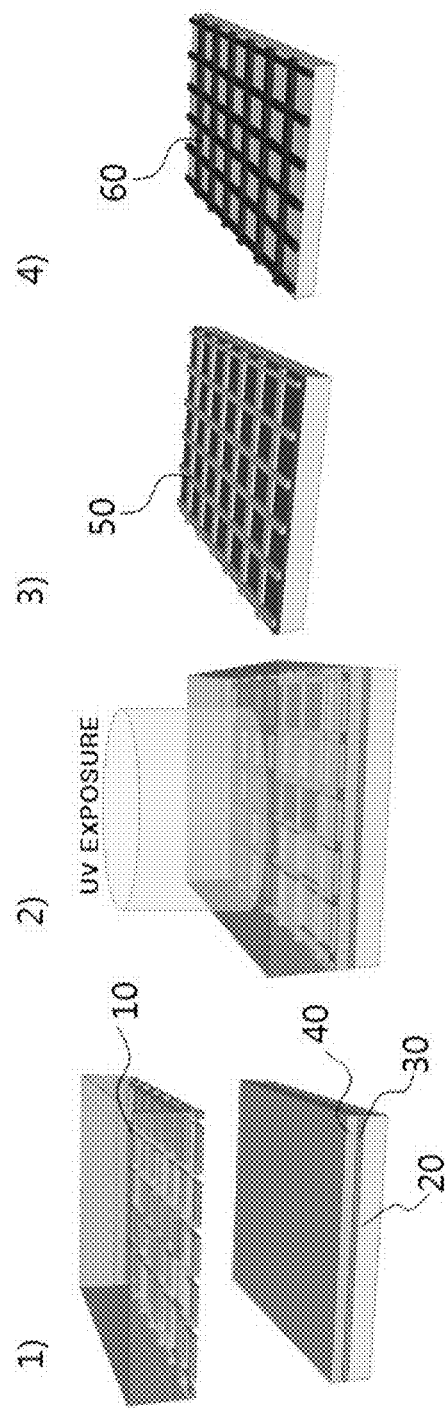
FIG. 8 is a flowchart of a method for manufacturing a conductive mesh pattern using the transparent photomask manufactured according to the exemplary embodiment of the present invention.

As illustrated in FIG. 8, a method for manufacturing conductive mesh patterns according to an exemplary embodiment of the present invention may include: ⓐ forming a photosensitive material layer 40 on a conductive layer 30 of a base substrate 20 including the conductive layer 30; ⓑ forming a photosensitive material mesh pattern layer 50 by making the transparent photomask 10 of the present invention be in contact with an upper surface of the photosensitive material layer 40; ⓒ etching a portion of the conductive layer on which a photosensitive material mesh pattern layer 50 is not formed; and ⓓ removing the photosensitive material mesh pattern layer 60 to manufacture conductive mesh patterns 60.

The conductive layer may include at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

The conductive layer may include a transparent metal oxide.

The type of transparent metal oxide is not specially limited, but may be selected from the transparent metal oxides generally used in the art. For example, the transparent metal oxide may include at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

Step ⓑ may include a step of irradiating ultraviolet rays onto the transparent photomask one time after the transparent photomask is in contact with the upper surface of the photosensitive material layer.

The photosensitive material layer is divided into a portion, to which ultraviolet rays are irradiated, and a portion, to which ultraviolet rays are not irradiated, by the transparent photomask and the portion of first photosensitive material layer, to which ultraviolet rays are irradiated, may have high solubility to the developer.

Intensity of the irradiated ultraviolet rays is not specially limited, but, may be, for example, 10 mJ/cm$^2$ or more and 200 mJ/cm$^2$ or less.

Step ⓑ may further include a step of removing the transparent photomask, developing the photosensitive material layer by using a developer, and forming the photosensitive material mesh pattern layer.

As long as a developer is a solution capable of melting the portion of the photosensitive material layer, to which ultraviolet rays are irradiated, the developer is not specially limited, but the developer may be an alkali developer, and for example, potassium hydroxide (KOH).

After the developing step, the method may further include drying the formed photosensitive material mesh pattern layer. In this case, a solvent and the like included in the photosensitive material mesh pattern layer may be gasified.

As long as a temperature enables the solvent and the like included in the photosensitive material mesh pattern layer to be gasified, a temperature for drying the photosensitive material mesh pattern layer is not specially limited.

Step ⓑ may further include curing the formed photosensitive material mesh pattern layer.

In the curing step, the cured photosensitive material mesh pattern layer may be hardened and fixated.

In the curing step, the temperature for curing the photosensitive material mesh pattern layer may be 150° C. or more and 250° C. or less.

The method for manufacturing the conductive mesh pattern of the present invention may be applied to a roll to roll process.

When the method for manufacturing the conductive mesh pattern of the present invention is applied to a roll to roll process, the transparent photomask may include a hollow cylindrical base substrate, a blanket provided on an external peripheral surface of the hollow cylindrical base substrate, and having concave mesh patterns with a line width of 100 nm or more and 900 nm or less, and an ultraviolet lamp provided inside the cylindrical base substrate.

The blanket having the concave mesh patterns is manufactured by the method for manufacturing the transparent photomask of the present invention, and is made of a flexible material providable onto the external peripheral surface of the hollow cylindrical base substrate. As long as a material of the blanket is providable onto the external peripheral surface of the hollow cylindrical base substrate, the material of the blanket is not specially limited, but may include, for example, at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof. Particularly, the material of the blanket may be a polydimethylsiloxane-based polymer.

In this case, as long as a material of the hollow cylindrical base substrate may enable ultraviolet rays to pass through and has a mechanical property capable of resisting impact applicable when the transparent photomask is rotated, the material of the hollow cylindrical base substrate is not specially limited, but the material of the hollow cylindrical base substrate may be quartz or glass.

When the method is applied to a roll to roll process, the base substrate provided with the conductive mesh patterns may be a flexible film. For example, the base substrate may be a plastic film, and a material of the plastic film is not specially limited, and may adopt a material generally used in the art.

A line width of the manufactured conductive mesh pattern may be 100 nm or more and 900 nm or less.

In the present invention, the "mesh" means a net shape, and may include a shape in which two or more lines cross, as well as orthogonal grid patterns.

The conductive mesh pattern may be a grid pattern in which lines of two groups are orthogonal to each other. A pitch of a linear pattern of a first group in a horizontal direction may be the same as or different from a pitch of a linear pattern of a second group in a vertical direction. Particularly, the pitch of the linear pattern of the first group may be the same as the pitch of the linear pattern of the second group.

Each of a line width of the linear pattern of the first group and a line width of the linear pattern of the second group may be 100 nm or more and 900 nm or less.

Each of the pitches of the linear patterns of the first and second groups may be 2 μm or more and 500 μm or less. Particularly, each of the pitches of the linear patterns of the first and second groups may be 10 μm or more and 80 μm or less.

The mesh electrode may further include an additional submicro pattern or micro pattern formed through an additional photosensitive material pattern layer. Particularly, the mesh electrode may further include a router pattern layer.

The mesh electrode may be used as at least one of a mesh electrode for a touch panel, an auxiliary electrode for an organic light emitting device, and a metal electrode for an organic light emitting device, and a mesh electrode for an organic solar cell. Particularly, the mesh electrode may be a mesh electrode for a touch panel.

When the transparent photomask of step ⓑ includes an opaque pattern layer provided on a surface of the transparent photomask in which concave mesh patterns are carved, an additional photosensitive material pattern layer may be formed together with the photosensitive material mesh pattern layer by making the transparent photomask provided with the opaque pattern layer be in contact with the upper surface of the photosensitive material layer.

As illustrated in 4) and 5) of FIG. 16, when the transparent photomask 10 includes the opaque pattern layer 70 provided on the surface of the transparent photomask 10 in which the concave mesh patterns are carved, it is possible to form an additional photosensitive material pattern layer 80 together with the photosensitive material mesh pattern layer 50 by making the transparent photomask provided with the opaque pattern layer be in contact with the upper surface of the photosensitive material layer.

The pattern of the additional photosensitive material pattern layer is not specially limited, but, for example, when the conductive layer has a mesh pattern for a touch panel, the pattern carved in the photomask may be a router pattern.

When the additional photosensitive material pattern layer is formed on the conductive layer together with the photosensitive material mesh pattern layer in step ⓑ, step ⓒ may be a step of etching portions of the conductive layer in which the photosensitive material mesh pattern layer and the additional photosensitive material pattern layer are not formed.

As illustrated in 5) and 6) of FIG. 16, when the additional photosensitive material pattern layer 80 is formed on the conductive layer together with the photosensitive material mesh pattern layer 50, the portions of the conductive layer 20 in which the photosensitive material mesh pattern layer 50 and the additional photosensitive material pattern layer 80 are not formed may be etched.

When the additional photosensitive material pattern layer is formed on the conductive layer together with the photosensitive material mesh pattern layer in step ⓑ, step ⓓ may be a step of manufacturing the conductive mesh patterns by removing the additional photosensitive material pattern layer together with the photosensitive material mesh pattern layer.

Mode for Carrying Out the Invention

Hereinafter, the present invention will be described in detail with reference to the Examples. However, the following Examples are set forth to illustrate the present invention, but do not intend to limit the present invention.

EXAMPLE

Example 1

Manufacture a Soft Contact Mask

Figure 9:
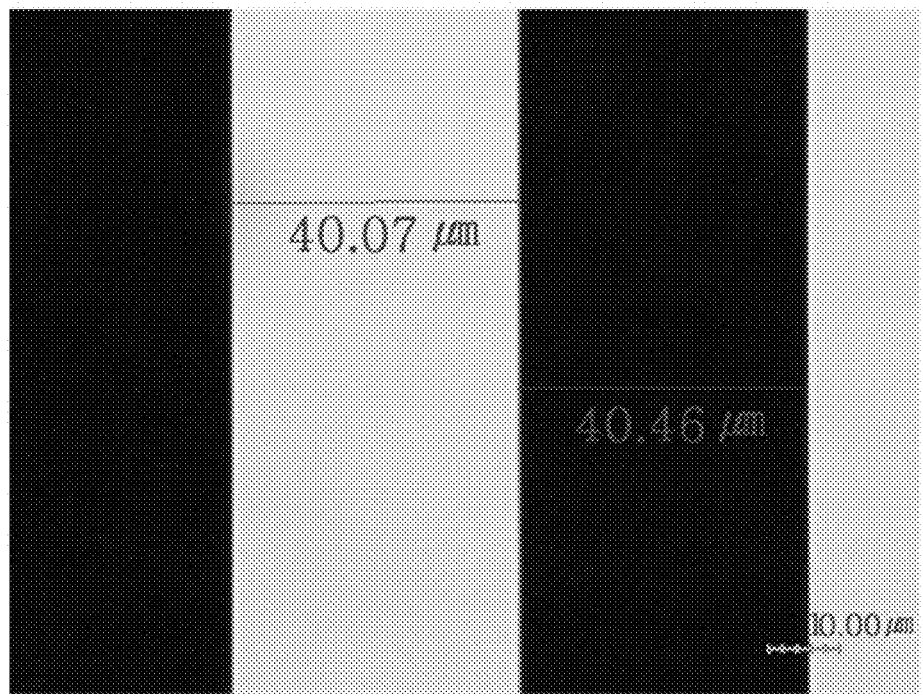
FIG. 9 is an optical microscope image of a chrome blank mask having a line pattern (repetition cycle 80 μm) having a line width of 40 μm of Example 1.
Figure 10:
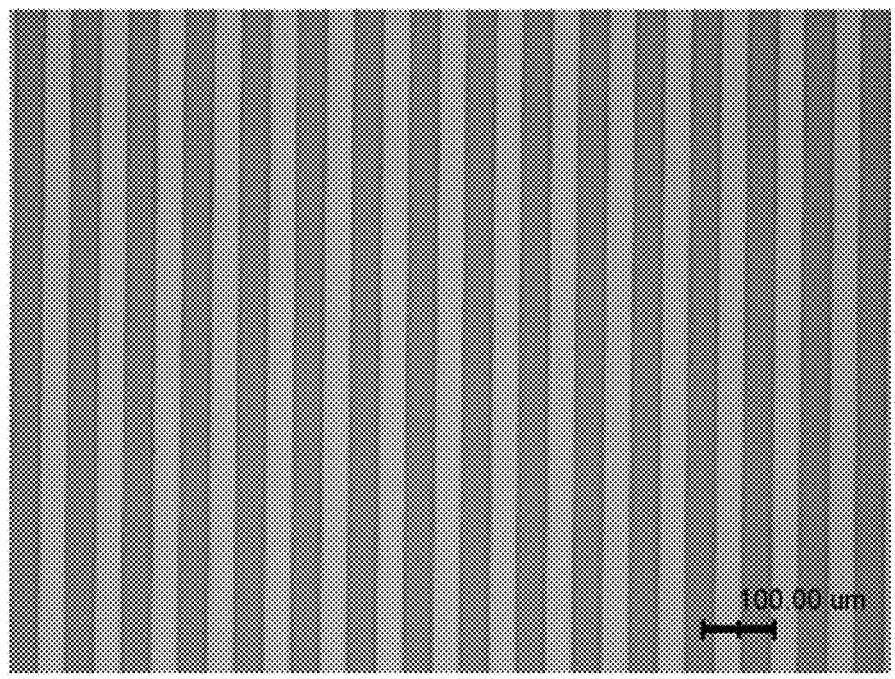
FIG. 10 is an optical microscope image of a transparent photomask, in which linear patterns are carved, manufactured according to Example 1.

As illustrated in FIG. 9, a pattern was manufactured by using an existing photolithography process by using a chrome (Cr) blank mask having a line pattern (about 80 μm of a repetition cycle) of a line width of about 40 μm and using a photosensitive material of AZ1512 (an undiluted solution) or SU8 25 (diluted by 300%, propylene glycol monomethyl ether acetate (PGMEA), a polydimethyl siloxane (PDMS) polymer and a hardener were mixed at a ratio of 9:1, the mixture was poured onto the pattern, the mixture was solidified by heat curing, the mixture was separated from the photosensitive material pattern to manufacture a PDMS transparent photomask in which linear patterns were carved. An optical microscope image of the manufactured transparent photomask is illustrated in FIG. 10.

Manufacture a Photosensitive Material Pattern

Figure 11:
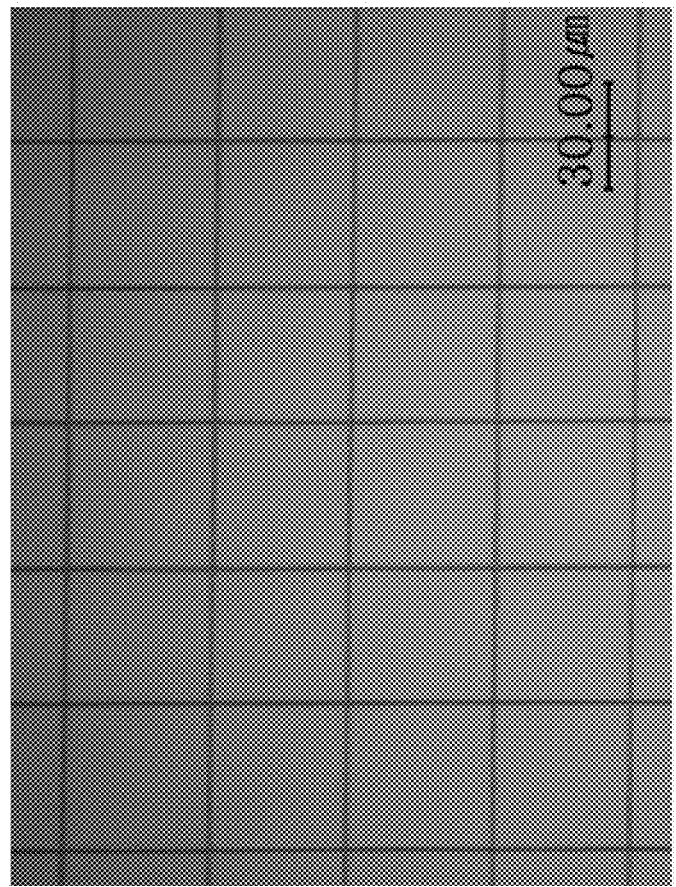
FIG. 11 is a schematic diagram and an optical microscope image of a photosensitive mesh pattern manufactured according to Example 1.
Figure 11:
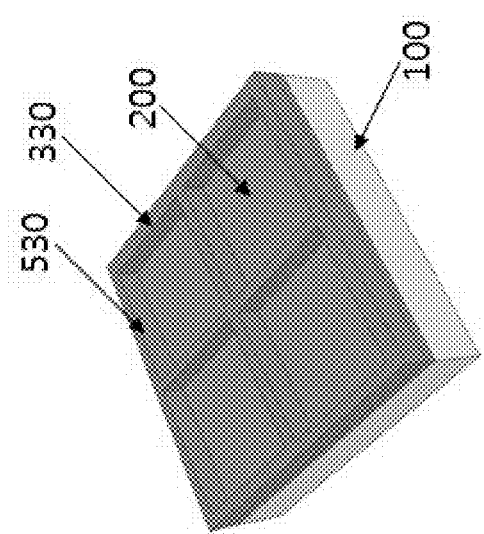

Aluminum (Al) was deposited on quartz in a thickness of 50 nm by a vacuum sputtering process, and then a first photosensitive material layer was formed by coating and drying a photosensitive material on aluminum (Al). In this case, a thickness of the first photosensitive material layer was adjusted to be about 100 nm to 400 nm. After the transparent photomask was in contact with the first photosensitive material layer, an exposed (Karl Suss MA8 mask aligner, 1000 W), developed (a developer CPD18), and dried first photosensitive material pattern layer was formed. In this case, the amount of exposure was adjusted to a range of 10 mJ/cm2 to 200 mJ/cm2. Then, the dried first photosensitive material pattern layer was heat treated at a temperature of 150° C. to 250° C. for about ten minutes and cured. Next, a second photosensitive material layer was additionally formed on an aluminum provided with the first photosensitive material pattern layer in the same order as that of the first photosensitive material pattern layer, and then a second photosensitive material pattern layer was formed on the aluminum by rotating the same transparent photomask at 90° and making the transparent photomask be in contact with the second photosensitive material layer, and then exposing, developing, drying, and curing the second photosensitive material layer. As a result, photosensitive material mesh patterns having a line width of 100 nm to 900 nm and a pitch of 40 μm were manufactured on the aluminum. A schematic diagram and an optical microscope image of the formed photosensitive material mesh pattern are illustrated in FIG. 11.

Manufacture a Conductive Mesh Pattern

Figure 12:
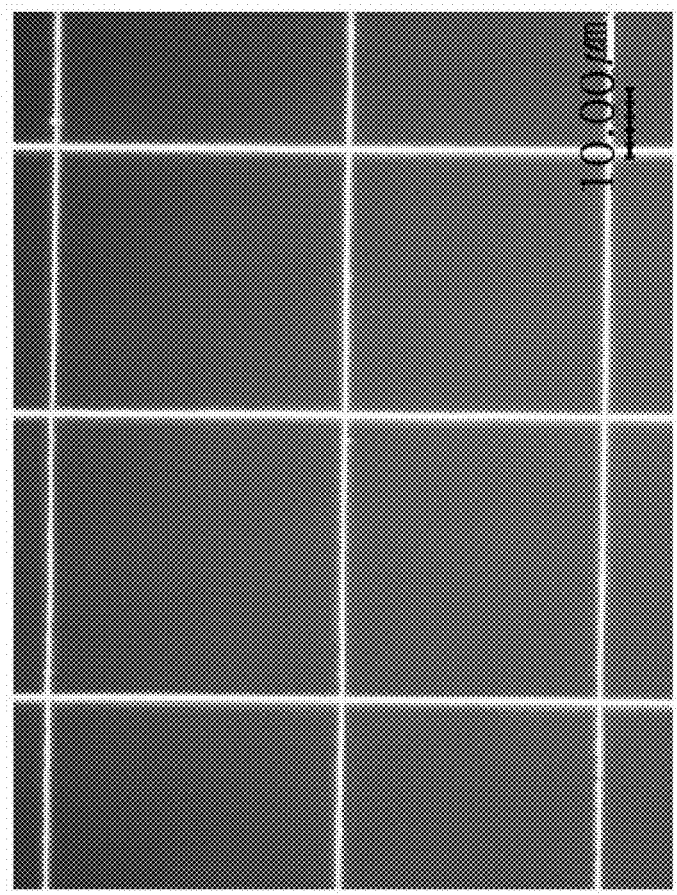
FIG. 12 is a schematic diagram and an optical microscope image of conductive mesh patterns manufactured according to Example 1.
Figure 12:
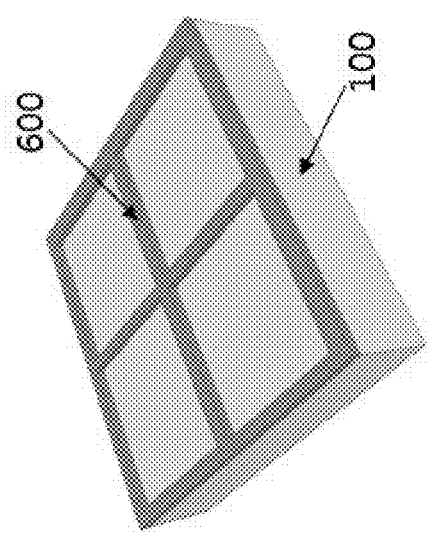

Conductive mesh patterns were manufactured by dry etching an Al layer having a thickness of 50 nm by using the mesh photosensitive patterns manufactured on the aluminum as an etch mask. A schematic diagram and an image of an optical microscope of the manufactured conductive mesh patterns are illustrated in FIG. 12.

In this case, a process condition of the dry etch is represented below.

Process pressure: 5 m Torr
Kind of gas and flow rate: $BCl_3:Cl_2=35:15$ sccm
Etch application power: ICP:RF=300:30 W
Manufacture a Master Mold Quartz was dry etched to have a thickness of 50 nm or more and 10 μm or less by using the aluminum mesh pattern having a thickness of 50 nm manufactured on the quartz as an etch mask, and then the aluminum mesh pattern was removed to manufacture a quartz master mold having convex mesh patterns.

Figure 13:
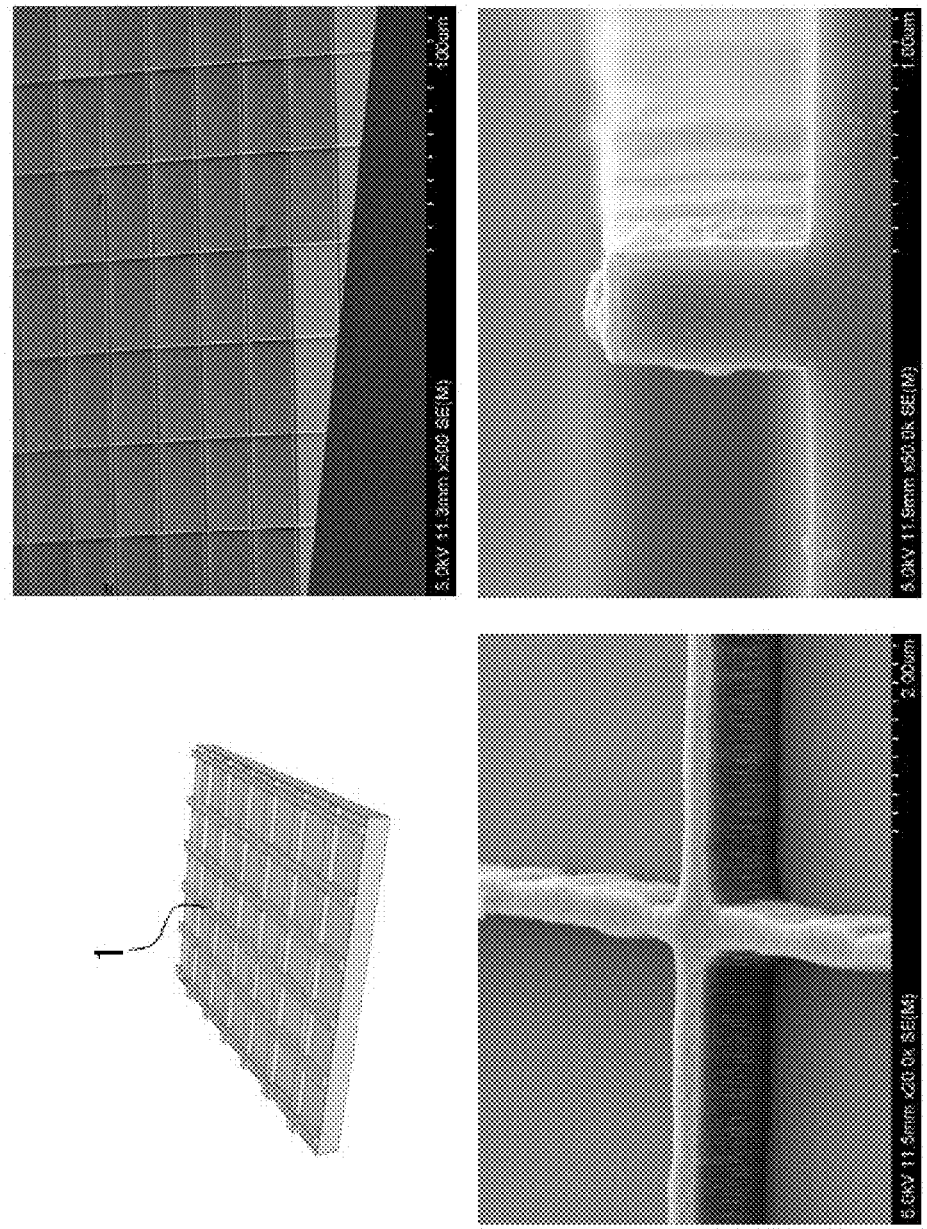
FIG. 13 is a schematic diagram and a scanning electronic microscope (SEM) image of a master mold manufactured according to Example 1.

A schematic diagram and a SEM image of the manufactured master mold are illustrated in FIG. 13.

In this case, a process condition of the dry etch is represented below.

Process pressure: 2 m Torr
Kind of gas and flow rate: $C_4F_8=30$ sccm
Etch application power: ICP:RF=10000:50 W
Manufacture a Transparent Photomask A polydimethyl siloxane (PDMS) polymer and a hardener were mixed at a ratio of 9:1, the mixture was poured to the patterns, the mixture was solidified by heat curing, the mixture was separated from the quartz master mold to manufacture a PDMS transparent photomask in which concave mesh patterns were carved. A depth of the mesh pattern of the PDMS transparent photomask is 830 nm, a pitch thereof is 40 μm, and a line width thereof is 550 nm.

Figure 14:
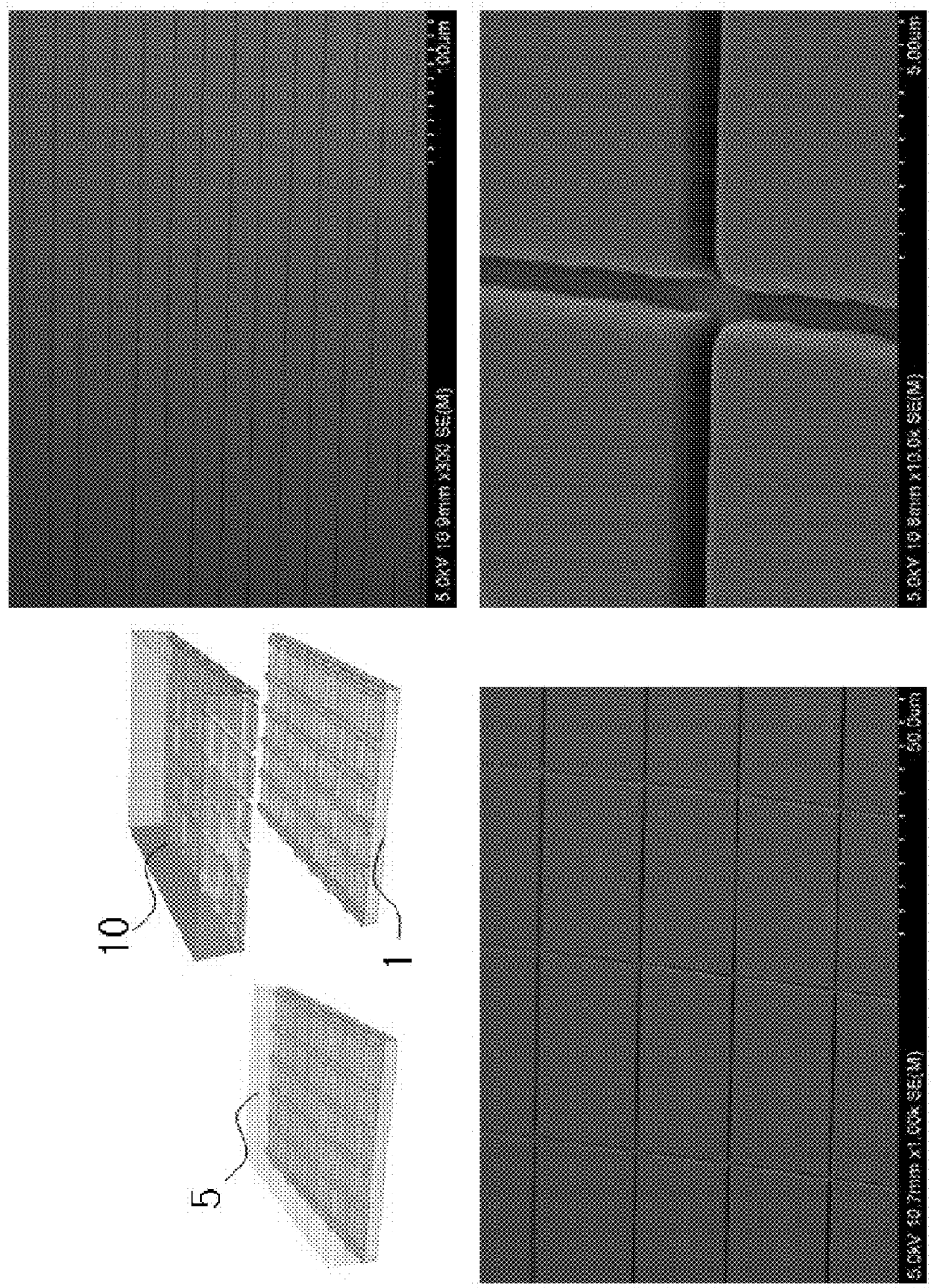
FIG. 14 is a schematic diagram and a SEM image of a transparent photomask in which a concave mesh pattern manufactured according to Example 1 is carved.

A schematic diagram and a SEM image of the manufactured transparent photomask are illustrated in FIG. 14.

Manufacture a Conductive Mesh Pattern

Aluminum (Al) was deposited on the quartz in a thickness of 50 nm by a vacuum sputtering process, and then a photosensitive material layer was formed by coating and drying a photosensitive material on aluminum (Al). In this case, a thickness of the photosensitive material layer was adjusted to be about 100 nm to 400 nm. After the transparent photomask, in which the concave mesh patterns were carved, was in contact with the photosensitive material layer, an exposed (Karl Suss MA8 mask aligner, 1000 W), developed (a developer CPD18), and dried photosensitive material mesh pattern layer was formed. In this case, the amount of exposure was adjusted to a range of 10 mJ/cm$^2$ to 200 mJ/cm$^2$. Then, the dried photosensitive material mesh pattern layer was heat treated at a temperature of 150° C. to 250° C. for about ten minutes and cured.

As a result, photosensitive material mesh patterns having a line width of 100 nm to 900 nm and a pitch of 40 μm were manufactured on the aluminum.

Conductive mesh patterns were manufactured by dry etching an Al layer having a thickness of 50 nm by using the photosensitive material mesh patterns manufactured on the aluminum as an etch mask.

In this case, a process condition of the dry etch is represented below.

Figure 15:
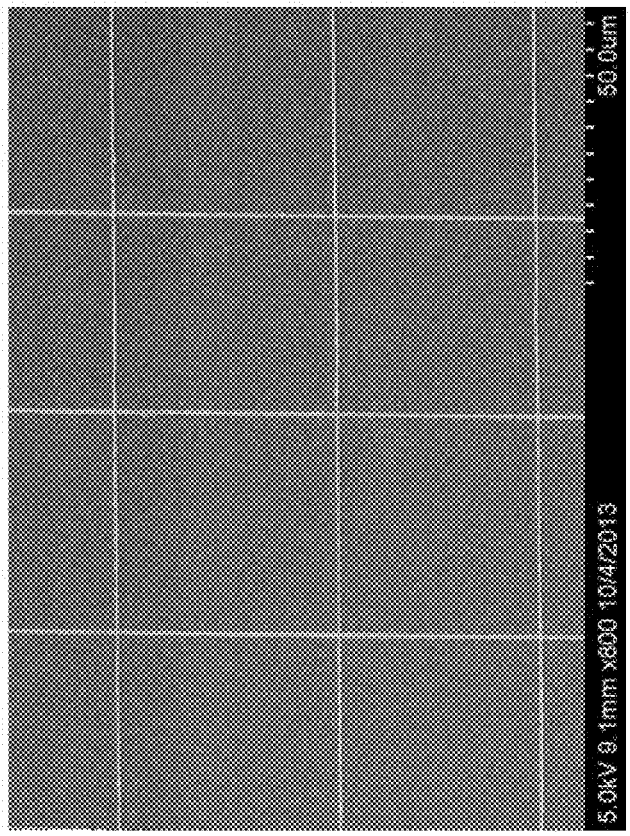
FIG. 15 is a schematic diagram and a SEM image of a conductive mesh pattern manufactured by using the transparent photomask in which the concave mesh pattern according to Example 1 is carved.
Figure 15:
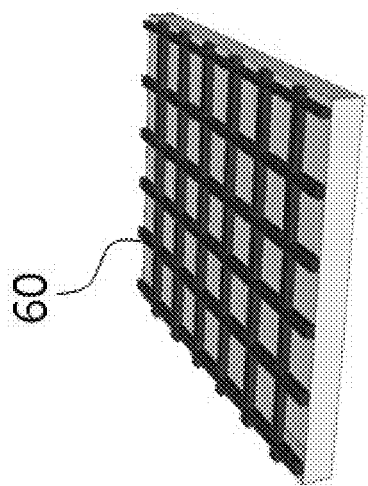

Process pressure: 5 m Torr
Kind of gas and flow rate: $BCl_3:Cl_2=35:15$ sccm
Etch application power: ICP:RF=300:30 W A schematic diagram and a SEM image of the manufactured conductive mesh patterns are illustrated in FIG. 15.

A height of the conductive mesh pattern is 50 nm, a pitch thereof is 40 μm, and a line width thereof is 800 nm.

The invention claimed is:

1. A method for manufacturing a master mold, comprising:
    a) forming a first photosensitive material layer on a base substrate;
    b) forming a first photosensitive material pattern layer by making a transparent photomask, in which linear patterns are carved, be in contact with an upper surface of the first photosensitive material layer;
    c) forming a second photosensitive material layer on the base substrate provided with the first photosensitive material pattern layer;
    d) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate;
    e) etching portions of the base substrate on which the first photosensitive material pattern layer and the second photosensitive material pattern layer are not formed; and
    f) removing the first photosensitive material pattern layer and the second photosensitive material pattern layer.

2. The method of claim 1, wherein the base substrate in step a) includes a conductive layer provided on one surface thereof, and
    step e) is a step of manufacturing conductive mesh patterns by etching portions of the conductive layer on which the first photosensitive material pattern layer and the second photosensitive material pattern layer are not formed, and
    the method further comprises:
    g) etching a portion of the base substrate on which the conductive mesh patterns are not formed after step f), and
    h) removing the conductive mesh patterns.

3. A master mold manufactured according to claim 1, and having convex mesh patterns having a line width of 100 nm or more and 900 nm or less,
    wherein the master mold is a master mold having integrated convex mesh patterns or a master mold having convex conductive mesh patterns on the base substrate.

4. A method for manufacturing a transparent photomask, comprising:
    1) forming a first photosensitive material layer on a base substrate;
    2) forming a first photosensitive material pattern layer by making a transparent photomask, in which linear patterns are carved, be in contact with an upper surface of the first photosensitive material layer;
    3) forming a second photosensitive material layer on the base substrate provided with the first photosensitive material pattern layer;
    4) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the base substrate;
    5) etching portions of the base substrate on which the first photosensitive material pattern layer and the second photosensitive material pattern layer are not formed;

6) manufacturing a master mold having convex mesh patterns by removing the first photosensitive material pattern layer and the second photosensitive material pattern layer;

7) forming a transparent resin layer on the master mold; and 8) removing the transparent resin layer from the master mold.

5. The method of claim 4, wherein the base substrate in step 1) includes a conductive layer provided on one surface thereof, and step 5) is a step of manufacturing conductive mesh patterns by etching portions of the conductive layer on which the first photosensitive material pattern layer and the second photosensitive material pattern layer are not formed.

6. The method of claim 5, further comprising:

etching a portion of the base substrate on which the conductive mesh patterns are not formed after step 6); and removing the conductive mesh patterns.

7. The method of claim 4, further comprising:

forming a third photosensitive material layer on the base substrate provided with the first photosensitive material pattern layer and the second photosensitive material pattern layer after step 4); and forming a third photosensitive material pattern layer on the base substrate.

8. A transparent photomask manufactured according to claim 4, and having concave mesh patterns having a line width of 100 nm or more and 900 nm or less.

9. The transparent photomask of claim 8, wherein a depth of the concave mesh pattern is 50 nm or more and 10 μm or less.

10. The transparent photomask of claim 8, wherein a pitch of the concave mesh pattern is 2 μm or more and 500 μm or less.

11. The transparent photomask of claim 8, wherein the transparent photomask includes at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof.

12. The transparent photomask of claim 8, further comprising:

an opaque pattern layer provided on a surface of the transparent photomask in which the concave mesh patterns are carved.

13. The transparent photomask of claim 12, wherein a pattern of the opaque pattern layer is a router pattern.

14. The transparent photomask of claim 12, wherein the opaque pattern layer includes a metal or carbon-based material.

15. The transparent photomask of claim 8, comprising:

a hollow cylindrical base substrate;

a blanket provided on an external peripheral surface of the base substrate, and having concave mesh patterns having a line width of 100 nm or more and 900 nm or less; and an ultraviolet lamp provided inside the cylindrical base substrate.

16. A method of manufacturing a conductive mesh pattern, comprising:

(a) forming a photosensitive material layer on a conductive layer of a base substrate including the conductive layer;

(b) forming a photosensitive material mesh pattern layer by making the transparent photomask of claim 15 be in contact with an upper surface of the photosensitive material layer;

(c) etching a portion of the conductive layer on which the photosensitive material mesh pattern layer is not formed; and (d) removing the photosensitive material mesh pattern layer to manufacture conductive mesh patterns.

17. The method of claim 16, wherein step (b) includes a step of irradiating ultraviolet rays onto the transparent photomask one time after the transparent photomask is in contact with the upper surface of the photosensitive material layer.

18. The method of claim 17, wherein intensity of the ultraviolet rays is 10 mJ/cm2 or more and 200 mJ/cm2 or less.

19. The method of claim 16, wherein a line width of the conductive mesh pattern is 100 nm or more and 900 nm or less.

20. The method of claim 16, wherein the conductive layer includes at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

* * * * *